United States Patent [19]

Marzinotto et al.

[11] Patent Number: 4,881,770
[45] Date of Patent: Nov. 21, 1989

[54] METHOD AND APPARATUS FOR TRANSPORTING PERFORATED OBJECTS

[75] Inventors: Francesco Marzinotto, Zürich, Switzerland; Jürgen Junghans, Hof, both of Switzerland

[73] Assignee: Ciba-Geigy AG, Basel, Switzerland

[21] Appl. No.: 118,934

[22] Filed: Nov. 10, 1987

[30] Foreign Application Priority Data

Nov. 10, 1986 [CH] Switzerland .................. 4481/86

[51] Int. Cl.$^4$ ............................................. B66C 1/02
[52] U.S. Cl. .................................................. 294/64.1
[58] Field of Search ................ 294/64.1, 65; 248/362, 248/363; 269/21

[56] References Cited

U.S. PATENT DOCUMENTS

| 2,953,808 | 9/1960 | Carmack . | |
|---|---|---|---|
| 3,523,707 | 8/1970 | Roth | 294/65 |
| 3,631,796 | 1/1972 | Hastings | 269/21 X |
| 3,743,340 | 7/1973 | Williamann | 294/64.1 |
| 4,049,484 | 9/1977 | Priest et al. | 294/64.1 X |
| 4,674,785 | 6/1987 | Riesenberg | 294/65 |
| 4,712,784 | 12/1987 | Carrell | 294/64.1 X |
| 4,799,722 | 1/1989 | Marzinotto . | |

FOREIGN PATENT DOCUMENTS

| 850797 | 9/1952 | Fed. Rep. of Germany . | |
|---|---|---|---|
| 1756327 | 5/1968 | Fed. Rep. of Germany . | |
| 3009580 | 3/1980 | Fed. Rep. of Germany . | |
| 2184072 | 12/1973 | France . | |
| 57-145723 | 8/1982 | Japan . | |
| 1249294 | 10/1971 | United Kingdom | 294/64.1 |
| 8304384 | 12/1983 | World Int. Prop. O. | 269/21 |

Primary Examiner—Johnny D. Cherry
Assistant Examiner—Gary C. Hoge
Attorney, Agent, or Firm—Burns, Doane, Swecker & Mathis

[57] ABSTRACT

A gripper head for connection with a suction device includes an air permeable suction plate having selected portions covered by a readily replaceable cover mask so that only the uncovered portions of the suction plate are suctionally active. The uncovered portions of a perforated object to be gripped by the gripper head having relatively few perforations.

21 Claims, 2 Drawing Sheets

METHOD AND APPARATUS FOR TRANSPORTING PERFORATED OBJECTS

CROSS-REFERENCE TO RELATED APPLICATION

This application is related to a co-pending allowed application entitled "Apparatus for Transporting Perforated Objects" filed Nov. 10, 1987, and assigned Ser. No. 07/118,935, now U.S. Pat. No. 4,799,722, issued Jan. 24, 1989.

BACKGROUND OF THE INVENTION

The present invention relates to a transport apparatus for perforated objects such as perforated circuit boards. More particularly, the present invention relates to a transport apparatus for removing perforated objects from a stack of such objects.

Frequently in the electronics industry, a circuit board must be removed from a stack of such boards and conveyed to a work station for further operations or installation. Automated devices are normally employed for this purpose. One type of automated device used for this purpose includes a vacuum operated gripper head which removes the top circuit board from the stack by means of suction. In the case of perforated circuit boards, however, difficulties often arise due to the tendency of such suction-operated gripper heads to lift more than one circuit board from the stack.

It is sometimes possible to reduce the tendency of the gripper head to lift more than one object by adjusting the suction power of the gripper head so that the weight of only a single circuit board will be supported. Adjustments of this type, however, must be highly accurate and, when possible, require expensive control devices. Furthermore, the transport device would require delicate adjustment whenever the type of circuit board being transported is changed.

Vacuum-type gripper devices are shown, for example, in U.S. Pat. No. 2,880,030, German Pat. Nos. 850,797, 3,009,580, and Japanese Laid-Open Patent Publication No. 57-145723. Additionally, German Pat. No. 1,756,327 relates to a device including a suction gripper for loading and unloading pallets. The side of the gripper which faces the pallets is closed off by a plate provided with orifices, with the center area of the plate having a dense area at the bottom of which an elastic sealing element is located. The dense area seals potential gaps between a plurality of pallets to be lifted to prevent loss of suction.

The present invention is an improvement over previous suction-operated transport devices. More particularly, the present invention simply and economically overcomes the undesirable tendency of known transport devices of removing more than a single circuit board from the top of a stack of perforated circuit boards.

BRIEF SUMMARY OF THE INVENTION

Briefly, the present invention overcomes the shortcomings of previous vacuum-operated gripper devices by selectively deactivating portions of the gripper head. In the preferred embodiment, a mask is provided to cover selected portions of the gripper head. By appropriate layout of the covering mask, the suctionally active portions of the gripper head may be tailored to coincide with areas of the perforated object which contain no, or relatively few, perforations. By selectively adapting the features of the gripper head to the object to be transported, the suction effect of the gripper head is not transmitted through the perforations of the topmost object to underlying objects. Thus, it is possible with the present invention to lift only the first object from a stack.

BRIEF DESCRIPTION OF THE DRAWINGS

The features, objects, and advantages of the present invention will become apparent from the following detailed description when read in light of the accompanying drawings, in which.

DETAILED DESCRIPTION OF THE PREFERRED EMBODIMENT

Figure 1:
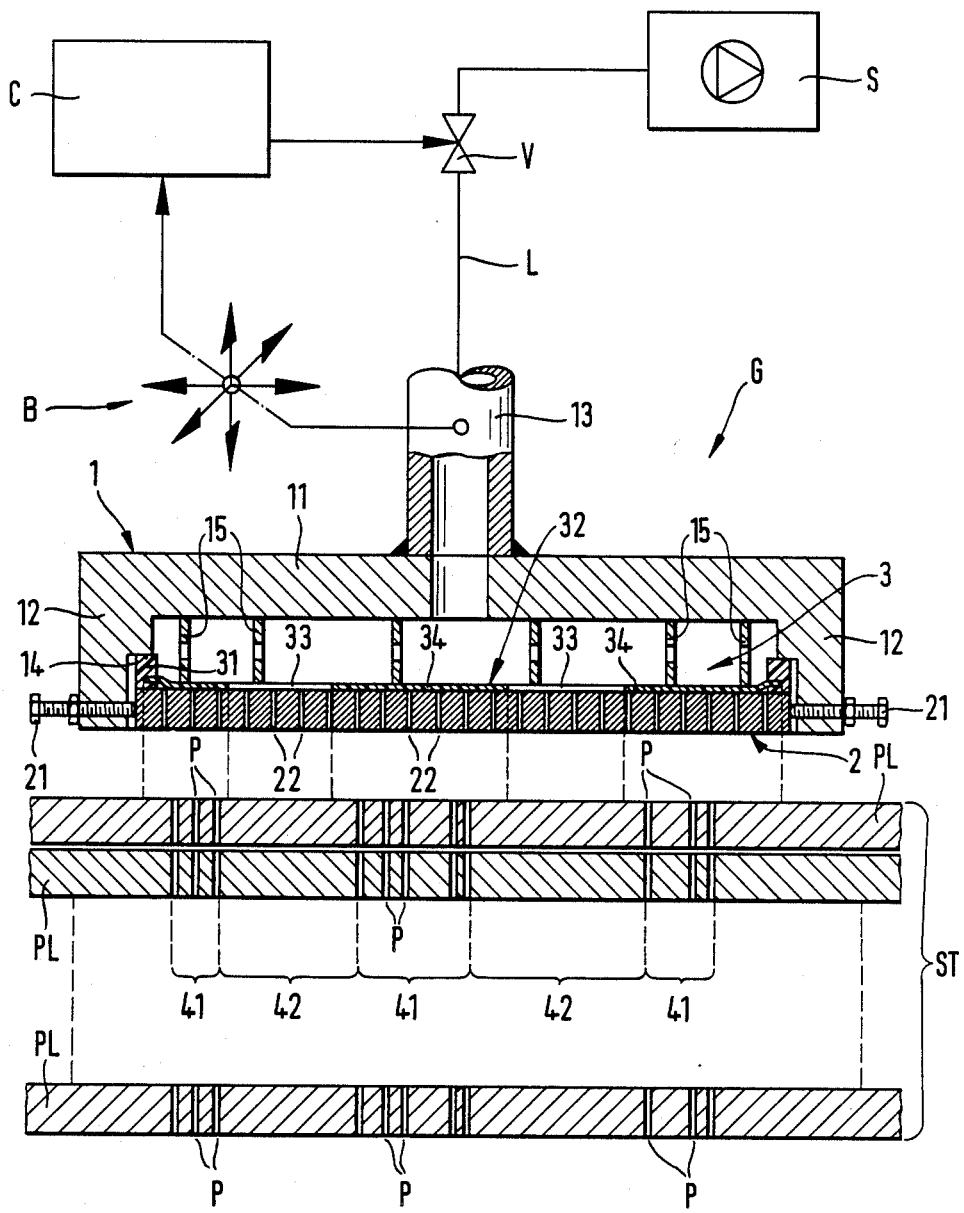
FIG. 1 is a schematic view of one embodiment of the present invention, including a detailed sectional view of a gripper head.

Referring to FIG. 1, a preferred embodiment of the transport device includes a gripper head G and a conventional suction device S connected with the gripper head G by a valved flexible vacuum line L. The position of the gripper head is preferably determined by a standard positioning device such as a robotic arm, indicated generally in FIG. 1 by directional arrows B. Of course, other positioning devices may be employed. A conventional control device C, such as a programmable controller or the like, is preferably provided to control operation of the valve V in vacuum line L and the positioning device B.

In the preferred embodiment, the gripper head G may include a base plate 11 and side walls 12 which define an airtight housing having a generally U-shaped cross-section. A nipple 13 is provided in base plate 11 for connecting the gripper head G with the suction device S through vacuum line L. A flat suction plate 2 is set in the open face of the housing 1, and is held therein by screws 21 or other suitable fasteners. In the embodiment of FIG. 1, the suction plate 2 may be constructed of a metal or plastic material, and includes a plurality of perforations 22 distributed over its surface.

A cover mask 3 is provided on the inner side of the suction plate 2. The cover mask 3 preferably comprises an air-tight membrane 32 stretched in a frame 31. The membrane 32 has open windows 33 through which air may pass, but the portions of the suction plate 2 opposite the portions 34 of the membrane 32 are effectively deactivated. The position and size of the windows 33 are determined by the features of the object to be transferred. The cover mask 3 may be retained in place by clamping the frame 31 between the suction plate 2 and shoulders 14 of housing side walls 12. Since the cover mask is merely clamped in place, it is readily exchangeable with different masks for transferring different perforated objects. Additionally, ribs 15 may be provided in the housing 1 to prevent the membrane 32 from bulging during operation. Alternatively, the cover mask 3 may be formed from a relatively rigid material.

As illustrated in FIG. 1, a stack ST includes a plurality of perforated electric circuit boards PL. The circuit boards PL include a relatively large number of perforations in areas 41, but are relatively free of perforations in areas 42. Of course, the pattern of the perforations on the circuit boards is determined by the conductor pattern on the circuit board.

In operation, the gripper head G is placed upon the uppermost circuit board PL of the stack ST by the positioning device. The suction device S may then be actuated, or the shutoff valve V may be opened, to produce a reduced pressure in the gripper head housing 1. The pressure drop across the suction plate 2 causes the uppermost circuit board to be held to the gripper head G. Due to the mask 3, suction is applied only to the portions of the circuit board which include relatively few perforations. Without the mask 3, on the other hand, the suction effect would be distributed evenly over the entire area of the suction plate 2 and would act through the perforations P of the circuit board, whereby one or more additional circuit boards may be held to the gripper head G.

As discussed above, the windows 33 are positioned so that they coincide with areas 42 of the perforated circuit board PL which contain relatively few perforations or no perforations. The areas 41 of the circuit board PL which have a relatively large number of perforations are thus aligned with the areas 32 of the mask 3. Accordingly, the suction effect cannot extend through the perforations P of the uppermost circuit board, and only the top circuit board is removed from the stack ST. Furthermore, the mask 3 is easily replaceable to permit simple modification of the gripper head G to accommodate different circuit boards.

Figure 2:
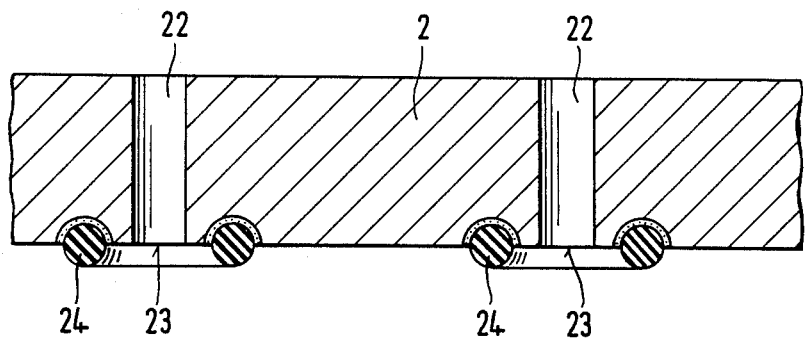
FIG. 2 illustrates a modification of the gripper head of FIG. 1.

In the embodiment of FIG. 1, the bottom of the suction plate 2 is flat. Referring now to FIG. 2, the suction effect may be improved by placing an O-ring 24 around the opening 23 of each perforation 22 of the suction plate 2. As shown, an O-ring seat may be provided in the gripper head for proper mounting of the O-ring. In place of the O-rings 24, a microsuction cup (not illustrated) or other elastic sealing means may be provided. The use of O-rings, however, is preferred since the O-rings lend a relatively high degree of stability to the gripper head assembly.

Figure 3:
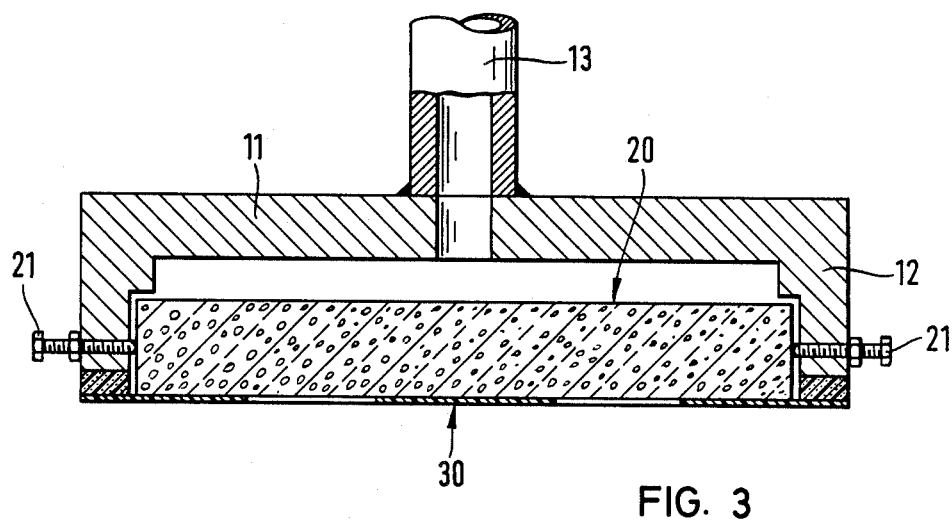
FIG. 3 illustrates a further embodiment of a gripper head in accordance with the present invention.

Turning now to FIG. 3, a mask 30 may be provided on the external surface of the suction plate. The mask 30 may be attached to the gripper head in any suitable manner. It is preferred, of course, that the mask 30 be easily replaceable to permit ready adaptation of the gripper head. Additionally, it is possible to use a porous, air permeable plate 20 in place of the perforated suction plate 2. A porous glass material is suitable for this purpose.

The principles, preferred embodiments and modes of operation of the present invention have been described in the foregoing specification. The invention which is intended to be protected herein, however, is not to be construed as being limited to the particular forms disclosed, since these are to be regarded as illustrative rather than restrictive. Variations and changes may be made by those skilled in the art without departing from the spirit of the invention. For example, the invention has been described in connection with the transport of perforated electric circuit boards, but could be adapted for use with other perforated objects.

What is claimed is:

1. A transport device for transporting perforated objects, comprising:
    a gripper head including a permeable suction plate;
    suction means connected with said gripper head for providing a pressure drop across said permeable suction plate;
    means for adjusting the position of said gripper head;
    means for controlling the operation of said suction means and said positioning means, said control means operable to place said gripper head against a perforated object and to actuate said suction means to hold said perforated object against said gripper head; and
    means for masking selected portions of said permeable suction plate, said selected portions being selected to align with portions of said perforated object having a relatively large number of perforations.

2. The apparatus of claim 1, wherein said masking means is replaceably mounted in the gripper head.

3. The apparatus of claim 2, wherein said masking means comprises an impermeable membrane including windows.

4. The apparatus of claim 3, wherein the membrane is clamped in a frame.

5. The apparatus of claim 4, wherein the masking means is mounted on the interior of said gripper head.

6. The apparatus of claim 5, wherein the positioning device places an external surface of said suction plate against the perforated object to be transferred, and wherein the permeable suction plate is a perforated suction plate, the perforations of said perforated plate being encircled by elastic sealing means on the external surface of said perforated suction plate.

7. The apparatus of claim 6, wherein said elastic sealing means is an O-ring, and said perforated suction plate is provided with an O-ring seat for mounting of the O-ring.

8. The apparatus of claim 5, wherein said gripper head includes a plurality of ribs for maintaining said membrane in place.

9. The apparatus of claim 5, wherein said membrane is formed of a relatively rigid material.

10. The apparatus of claim 1, wherein said masking means comprises an impermeable membrane including windows.

11. The apparatus of claim 1, wherein said permeable suction plate is formed from a porous material which is permeable to air.

12. A method of transporting a perforated object from a first location to a second location, comprising the steps of:
    masking selected portions of a suction plate of a vacuum-operated gripper head, said selected portions being chosen to correspond with portions of said perforated object having a relatively large number of perforations;
    placing said gripper head against said perforated object at said first position;
    applying a pressure drop across said suction plate to hold said perforated object against said gripper head;
    moving said gripper head and said perforated object to said second location; and
    removing the pressure drop across said suction plate to release said perforated object.

13. A gripper head used in a vacuum operated transport device for transporting perforated objects, comprising:
    a base plate;
    a plurality of side walls attached to said base plate to define a housing having a generally U-shaped cross-section;

a permeable suction plate mounted to said side walls opposite said base plate; and a cover mask, replaceably mounted in said gripper head, for covering selected portions of said suction plate, said cover mask being an impermeable membrane including windows, said gripper head further including a plurality of ribs for maintaining said membrane in place.

14. A gripper head used in a vacuum operated transport device for transporting perforated objects, comprising:

a base plate;

a plurality of side walls attached to said base plate to define a housing having a generally U-shaped cross-section;

a permeable suction plate mounted to said side walls opposite said base plate; and, a cover mask, replaceably mounted in said gripper head, for covering selected portions of said suction plate, said cover mask being an impermeable membrane including windows, wherein said membrane is formed of a relatively rigid material.

15. A gripper head used in a vacuum operated transport device for transporting perforated objects, comprising:

a base plate;

a plurality of side walls attached to said base plate to define a housing having a generally U-shaped cross-section;

a permeable suction plate mounted to said side walls opposite said base plate; and, a cover mask, replaceably mounted in said gripper head, for covering selected portions of said suction plate, said cover mask being an impermeable membrane including windows, wherein the membrane is clamped in a frame.

16. A gripper head used in a vacuum operated transport device for transporting perforated objects, comprising:

a base plate;

a plurality of side walls attached to said base plate to define a housing having a generally U-shaped cross-section;

a permeable suction plate mounted to said side walls opposite said base plate; and, a cover mask, replaceably mounted in said gripper head, for covering selected portions of said suction plate, said cover mask being an impermeable membrane including windows;

wherein the masking means is mounted on the interior of said gripper head.

17. The gripper head of claim 16, wherein the positioning device plates an external surface of said suction plate against the perforated object to be transferred, and wherein the permeable suction plate is a perforated suction plate, the perforations of said perforated plate being encircled by elastic sealing means on the external surface of said perforated suction plate.

18. The gripper head of claim 17, wherein said elastic sealing means is an O-ring, and said perforated suction plate is provided with an O-ring seat for mounting of the O-ring.

19. The gripper head of claim 16, wherein said gripper head includes a plurality of ribs for maintaining said membrane in place.

20. The gripper head of claim 16, wherein said membrane is formed of a relatively rigid material.

21. A gripper head used in a vacuum operated transport device for transporting perforated objects, comprising:

a base plate;

a plurality of side walls attached to said base plate to define a housing having a generally U-shaped cross-section;

a permeable suction plated mounted to said side walls opposite said base plate, said permeable suction plate being formed from a porous material which is permeable to air; and, a cover mask, replaceably mounted on said gripper head, for covering selected portions of said suction plate.

* * * * *